(12) United States Patent
Quinton et al.

(10) Patent No.: US 8,736,300 B2
(45) Date of Patent: May 27, 2014

(54) IN-CIRCUIT DATA COLLECTION USING CONFIGURABLE SELECTION NETWORKS

(75) Inventors: Bradley R. Quinton, Vancouver (CA); Andrew M. Hughes, Vancouver (CA); Steven J. E. Wilton, Vancouver (CA)

(73) Assignee: Tektronix, Inc., Beaverton, OR (US)

( * ) Notice: Subject to any disclaimer, the term of this patent is extended or adjusted under 35 U.S.C. 154(b) by 177 days.

(21) Appl. No.: 13/344,427

(22) Filed: Jan. 5, 2012

(65) Prior Publication Data

US 2012/0176153 A1 Jul. 12, 2012

Related U.S. Application Data

(60) Provisional application No. 61/430,459, filed on Jan. 6, 2011.

(51) Int. Cl.
*H03K 19/00* (2006.01)
(52) U.S. Cl.
USPC ............ 326/16; 326/9; 326/14; 326/41
(58) Field of Classification Search
None
See application file for complete search history.

(56) References Cited

U.S. PATENT DOCUMENTS

| | | | | |
|---|---|---|---|---|
| 7,827,510 | B1 * | 11/2010 | Schubert et al. | 716/136 |
| 2003/0110429 | A1 * | 6/2003 | Bailis et al. | 714/725 |
| 2003/0154458 | A1 * | 8/2003 | Butts et al. | 716/17 |

* cited by examiner

*Primary Examiner* — Anh Tran
(74) *Attorney, Agent, or Firm* — Kristofer E. Ebling; Thomas F. Lenihan; Marger Johnson & McCollom PC

(57) ABSTRACT

In one general aspect, a data collection system for a circuit under test implemented as an integrated circuit or using a programmable logic device is disclosed. It comprises a configurable selection network connected to debug nodes of the circuit. The selection network can be reconfigured after implementation of the circuit to route data from selectable debug nodes in the circuit under test to a controller to allow analysis of the circuit. The data collection system can further comprise a configurable data packer. A method of use of the system associates data from the debug nodes with individual debug nodes of the circuit based on a configuration of the configurable selection network or that of the configurable data packer or both. The method and system of the invention allows for efficient data collection from different sets of debug nodes without having to re-implement the circuit.

17 Claims, 3 Drawing Sheets

IN-CIRCUIT DATA COLLECTION USING CONFIGURABLE SELECTION NETWORKS

CLAIM FOR PRIORITY

The subject application claims the benefit of U.S. Provisional Patent Application Ser. No. 61/430,459, filed 6 Jan. 2011, and hereby incorporated by reference in its entirety.

FIELD OF THE INVENTION

This invention relates, in general, to electrical circuits. More specifically, this invention relates to collecting data in order to perform analysis of these circuits and their operation.

BACKGROUND OF THE INVENTION

Often during the process of developing circuits it is necessary to collect data in order to perform analysis of the circuit and its operation. This is required for a number of reasons including, but not limited to (a) when the circuit does not perform as expected, (b) to determine the performance limits of the circuit, and (c) to enable the optimization of the circuit.

For circuits implemented as integrated circuits, and for those implemented using programmable logic devices, additional circuitry may be added to the original circuit before implementation to collect data, process it and transfer it off the integrated circuit or programmable logic device for analysis. In the present specification the additional circuits are referred to as "instruments" and the process of adding them to an existing circuit is referred to as "instrumentation". In the present specification the circuit before the addition of instruments is referred to as the "original circuit" and the points in the original circuit connected to the instruments are referred to as "debug nodes". In the present specification "implementation" is the process of realizing a circuit from an abstract definition of desired behaviour. Further, software may be used to process, analyze and display the data from these instruments. This software is referred to in the present specification as "debug software".

The primary challenge of this approach to data collection is that the number of debug nodes that require instrumentation in the original circuit may be large. Furthermore, adding additional circuits for instrumentation may affect the cost and reduce the performance of the circuit. Therefore, the size and impact of the circuits used as instruments needs to be minimized. In addition, the physical pins available on the device and their maximum operating frequency limit the bandwidth available to transfer data off the integrated circuit or programmable logic device. Finally, adding or modifying instruments to observe new debug nodes or combinations of debug nodes in the original design is difficult and time consuming for circuits implemented in both integrated circuits and programmable logic devices and furthermore is very expensive in integrated circuits.

To manage these challenges, existing approaches typically either limit the total number of debug nodes that may be instrumented, or require that users decide, in advance, all of the potential combinations of debug nodes that will require observation to fully understand the operation of the original circuit. The result is that existing prior art approaches tend to be time-consuming, inefficient and costly.

SUMMARY OF THE INVENTION

Embodiments according to the invention can provide a capability to facilitate the instrumentation of circuits implemented as integrated circuits or using programmable logic devices. In particular, means and methods can be provided to instrument a large number of debug nodes in the original circuit without having to decide, in advance, the number and combination of the debug nodes that are to be observed once the design is implemented. Embodiments according to the invention can also ensure that there is minimum impact on the original circuit and that, once the specific a subset of debug nodes to be observed is configured, the instrumentation provides the maximum possible utilization of available resources.

In embodiments of the present invention shortcomings of the prior art can be overcome and additional advantages can be provided through the combination of a configurable selection network, a configurable data packer, a data storage element and debug software. The configurable selection network is connected to all debug nodes in the circuit that will potentially be of interest, and then re-configured for each new observation. The configurable data packer is configured to enable efficient use of the storage element based on the number of debug nodes selected in a specific configuration of the configurable selection network. The debug software is used to interpret the data stored in the storage element. The interpretation is based on the configuration of the configurable selection network and the configuration of the configurable data packer.

Embodiments according to the present invention can also provide a method and system to configure the instruments to create efficient data collection systems specifically for each new subset of debug nodes without having to re-implement the circuit.

In one embodiment of the present invention the use of a configurable unordered selection network reduces the instrumentation overhead as regards additional silicon area and programmable logic device resources and improves the maximum operating frequency of the instrumented circuit. The selection network is combined with debug software that can compute the resulting ordering of the observations made using the network without reduction of the overall effectiveness of the data collection system.

More specifically, in one general aspect, the invention features a data collection system for an electrical circuit. The data collection system includes a configurable selection network that includes configurable selection logic, data input lines operatively connected to a first set of debug nodes of the electrical circuit and the configurable selection logic, data output lines operatively connected to the configurable selection logic, and a configuration control input operatively connected to the selection logic to configure the selection logic.

In preferred embodiments, the configurable selection network can be a non-blocking network. The non-blocking network can be a configurable unordered selection network. The configurable selection network can be configurable after implementation of the electrical circuit to obtain data from a second set of debug nodes of the electrical circuit, with the second set of debug nodes being a subset of the first set of debug nodes. The data collection system can further include a configurable data packer, and a data storage element. The data collection system of claim can further include a controller arranged to configure the configurable data packer based on a configuration of the configurable selection network. A controller can be arranged to associate data from the second set of debug nodes with individual debug nodes of the electrical circuit based on at least one of a configuration of the configurable selection network, and a configuration of the configurable data packer.

In another general aspect, the invention features a design tool for generating a data collection system for an electrical circuit that includes a design module operative to specify a configurable selection network. The network includes configurable selection logic, data input lines operatively connected to a first set of debug nodes of the electrical circuit and the configurable selection logic, data output lines operatively connected to the configurable selection logic, and a configuration control input operatively connected to the selection logic to configure the selection logic.

In a further general aspect, the invention features a machine-readable design specification for a data collection system for an electrical circuit, stored in a non-transitory storage medium. It comprises a machine-readable design specification for a configurable selection network that includes configurable selection logic, data input lines operatively connected to a first set of debug nodes of the electrical circuit and the configurable selection logic, data output lines operatively connected to the configurable selection logic, and a configuration control input operatively connected to the selection logic to configure the selection logic.

In another general aspect, the invention features a method for collecting data from debug nodes of an electrical circuit that includes providing access to the debug nodes of the electrical circuit, selecting a first of a plurality of possible subsets of the debug nodes, and routing data from the first subset of the nodes to outputs of the circuit. In preferred embodiments, the method can further include selecting a second of the plurality of possible subsets of the debug nodes, and routing data from the second subset of the nodes to outputs of the circuit.

In a further general aspect, the invention features a method for collecting data from debug nodes of an electrical circuit. The electrical circuit comprises a configurable selection network connected to a first set of debug nodes, and the method comprises configuring the configurable selection network to route data from a second set of debug nodes to outputs of the configurable selection network, with the second set of debug nodes being a subset of the first set of debug nodes, configuring the configurable selection network to route data from a third set of debug nodes to outputs of the configurable selection network, with the third set of debug nodes being a subset of the first set of debug nodes and the third set of debug nodes being a different set from the second set of debug nodes.

In another general aspect, the invention features a method for collecting data from debug nodes of an electrical circuit. The electrical circuit comprises a configurable data packer and a configurable selection network, with the configurable selection network connected to a first set of debug nodes. The method includes configuring the configurable selection network to route data from a second set of debug nodes to outputs of the configurable selection network, the second set of debug nodes being a subset of the first set of debug nodes, and configuring the data packer based on a configuration of the configurable selection network. In preferred embodiments, the method further includes associating data from the second set of debug nodes with individual debug nodes of the electrical circuit based on at least one of a configuration of the configurable selection network, and a configuration of the configurable data packer.

Methods and systems relating to aspects of the present invention are described and claimed herein. Additional features and advantages are realized through the techniques of the present invention. Other embodiments and aspects of the present invention are described in detail herein and are considered a part of the claimed invention.

BRIEF DESCRIPTION OF THE DRAWINGS

Aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

In accordance with an aspect of the present invention, a system is provided for collecting and processing data from a circuit implemented as an integrated circuit or using a programmable logic device.

Figure 1:
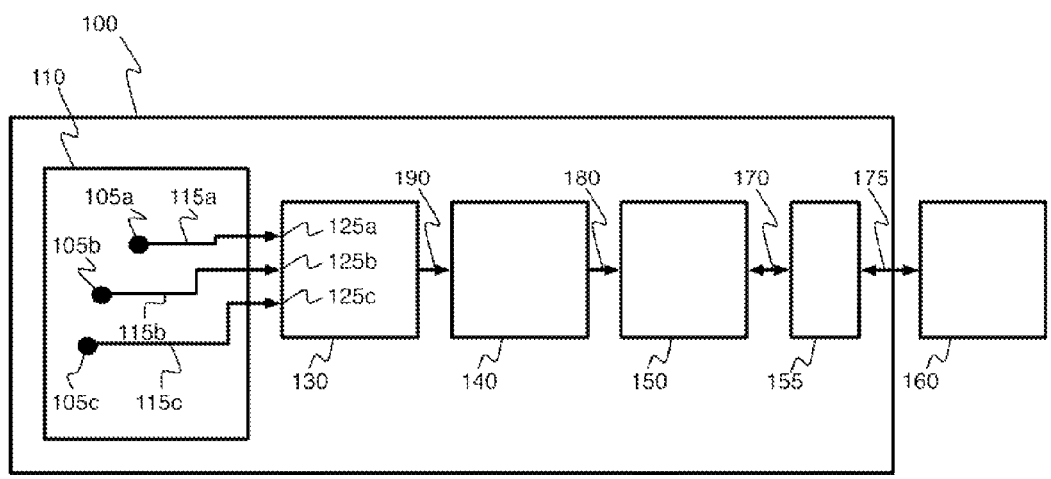
FIG. 1 depicts a circuit with the addition of the data collection system of the present invention.

One embodiment of a circuit enhanced with the present invention is shown in FIG. 1. The enhanced circuit 100 comprises the original circuit and the instruments. The enhanced circuit of the present invention may be implemented as an integrated circuit or using a programmable logic device. The original circuit 110 contains N debug nodes targeted for data collection. For the sake of clarity we include only three debug nodes in FIG. 1: 105a, 105b, 105c. Debug nodes 105a, 105b, 105c are connected to N wires. Again, for the sake of clarity we include only three wires 115a, 115b, 115c. The N wires represented by 115a, 115b, 115c are connected to N networks inputs 125a, 125b, 125c on configurable selection network 130. N may be any non-zero positive integer.

Configurable selection network 130 has M network outputs 190 connected to configurable data packer 140. Configurable selection network 130 provides connections from the N network inputs 125a, 125b, 125c to the M network outputs 190. The number of data packer outputs 180 from configurable data packer 140 is equal to the number M of network outputs 190 providing data to configurable data packer 140. The configurable data packer organizes incoming data such that it can be stored efficiently by data storage element 150.

Configurable data packer 140 is connected to the data storage element 150 via configurable data packer outputs 180. Data storage elements are well known in the prior art, for example, a Static Random Access Memory (SRAM) embedded in an integrated circuit or programmable logic device. In one embodiment of the invention, the number M of network outputs 190 may be determined before implementation based on the total number of simultaneous observations required, which must be less than or equal to the number of configurable data packer outputs 180 serving data storage element 150.

The number M of network outputs 190 does not need to correspond to the number N of instrumented debug nodes. In general, the number N of network inputs 125a, 125b, 125c to configurable selection network 130 will be larger than the number M of network outputs 190. In one embodiment configurable selection network 130 is arranged such that any of the N network inputs 125a, 125b, 125c can be configured to connect to any of the M network outputs 190. Networks of this type are commonly referred to as "non-blocking networks" and are well known in the prior art, for example a Clos network used in telephone switching.

In an embodiment of the present invention configurable selection network 130 is arranged such that any subset K of the N network inputs 125a, 125b, 125c, where K is a positive non-zero integer smaller than or equal to M, can be configured to connect to one of the M network outputs 190, but the mapping of elements of K to specific ones of the M outputs cannot be specified. Networks of this type are referred to in this specification as "configurable unordered selection networks". A configurable unordered selection network therefore provides a subset of the connectivity of a non-blocking network.

Data storage element 150 is connected to debug interface 155. Debug interface 155 is arranged to read data from data storage element 150 via interface connection 170 and transfers the data to controller 160 via data analysis connection 175. Interface connection 170 to debug interface 155 does not necessarily need to match the transfer capacity of data packer outputs 180 to data storage element 150 since stored data can be removed at a different rate than the data is collected. Methods for accessing stored data in this way are well known in the prior art, for example, using the Advanced Microprocessor Bus Architecture (AMBA) family of bus specifications. Data analysis connection 175 transfers data off enhanced circuit 100 and may be implemented in a number of ways, for instance using the Joint Test Action Group (JTAG) standard. This bus or other communication paths can be used to convey control signals from the controller to the configurable selection network 130, the data packer 140, and the data storage element 150.

Figure 2:
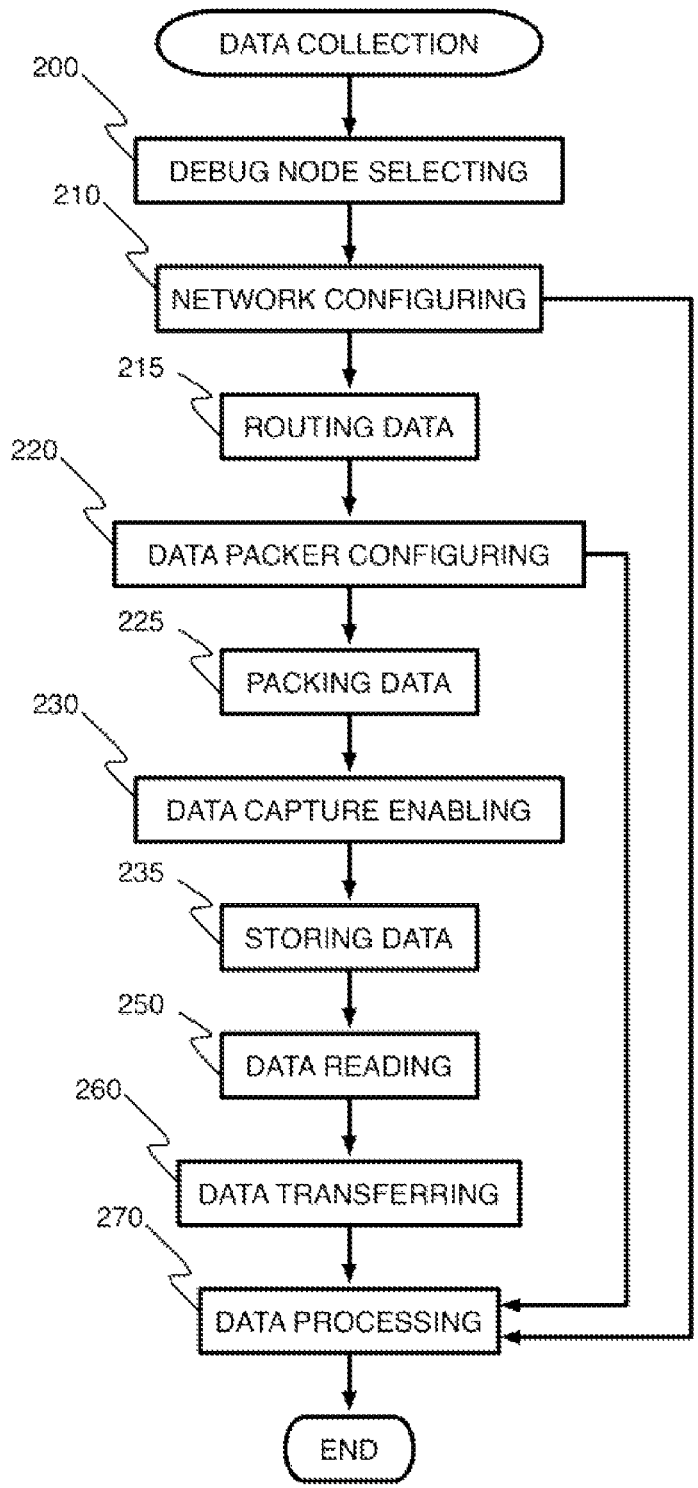
FIG. 2 depicts one embodiment of the method of the present invention.

In an aspect of the present invention a method is presented in FIG. 2 for data collection. In a debug node selecting step 200 a number S of the instrumented debug nodes less than or equal to M are selected for observation. This selection is done in a multiplicity of ways including by the users entering values into the debug software, or by selection algorithms built into the debug software itself.

In network configuring step 210, configurable selection network 130 is configured to route S network inputs 125a, 125b, 125c to S network outputs 190. In one embodiment of the present invention the configurable selection network 130 is a non-blocking network and each S network input 125a, 125b, 125c is configured to connect to a specific network output 190. This information is recorded for use in data processing step 270. In another embodiment of the present invention the configurable selection network 130 is a configurable unordered selection network and only the S network inputs 125a, 125b, 125c are selectable and the connection to each network output 190 is not configurable. In this case only the selected S network inputs 125a, 125b, 125c are recorded for later use in data processing step 270.

In data routing step 215, configurable selection network 130 connects the S network inputs 125a, 125b, 125c targeted for data collection to the S network outputs 190.

In a data packer configuring step 220, data packer 140 is configured with information on which of the M network outputs 190 are valid based on the configuration of configurable selection network 130. This information is recorded for use in data processing step 270.

In data packing step 225 configurable data packer 140 stores and organizes the valid data to fill data packer outputs 180 with as much valid data as possible. Using this procedure configurable data packer 140 will not have valid output data at all times, instead it will signal to data storage element 150 at which time the data on data packer outputs 180 is valid for capture.

In a data capture enabling step 230 data storage element 150 is enabled and data capture begins.

In storing data step 235 data storage element 150 stores data in a form accessible by debug interface 155.

The stored data is read by debug interface 155 in a data reading step 250. The data may be read in one of while it is being captured, or after the capture has been halted. Note the incoming data may exceed the storage available in the data storage element. There are a number of well-known methods in the prior art to address this, for example the oldest data may be continuously over-written.

As data is read by debug interface 155 it is transferred to controller 160 in data transferring step 260. The process of reading the data and transferring it continues until all of the captured data has been transferred to the debug software or the debug software halts the transfer process.

In a data processing step 270 debug software instructs controller 160 to process the data using configuration information from network configuring step 210 and data packer configuring step 220 as well as the post-configuration behaviour of both configurable selection network 130 and configurable data packer 140. In one embodiment of the present invention the configurable selection network 130 is a non-blocking network and therefore the connection between network inputs 125a, 125b, 125c and network outputs 190 is known and used directly. In another embodiment of the present invention the configurable selection network 130 is a configurable unordered selection network and debug software must compute the connections between the network inputs 125a, 125b, 125c and network outputs 190 based on the behaviour of the configurable unordered selection network. The result is that data from each of selected subset of debug nodes 105a, 105b and 105c can be presented to the user as a contiguous set of values over time and the full capacity of the data storage element is used to capture the maximum possible data.

In an embodiment of the method of the present invention configurable selection network 130 is configured by controller 160 to route data first from one subset of debug nodes 105a, 105b, 105c to network outputs 190 and from there to configurable data packer 140 and to the rest of the system of the invention as already described herein. When required data has been acquired in this fashion, configurable selection network 130 is reconfigured by controller 160 to route data from another subset of debug nodes for analysis by the system of the invention. The two subsets may have member debug nodes in common. This method relies directly on the software reconfigurability of configurable selection network 130 and demonstrates an inherent advantage of the present invention over the prior art.

Figure 3:
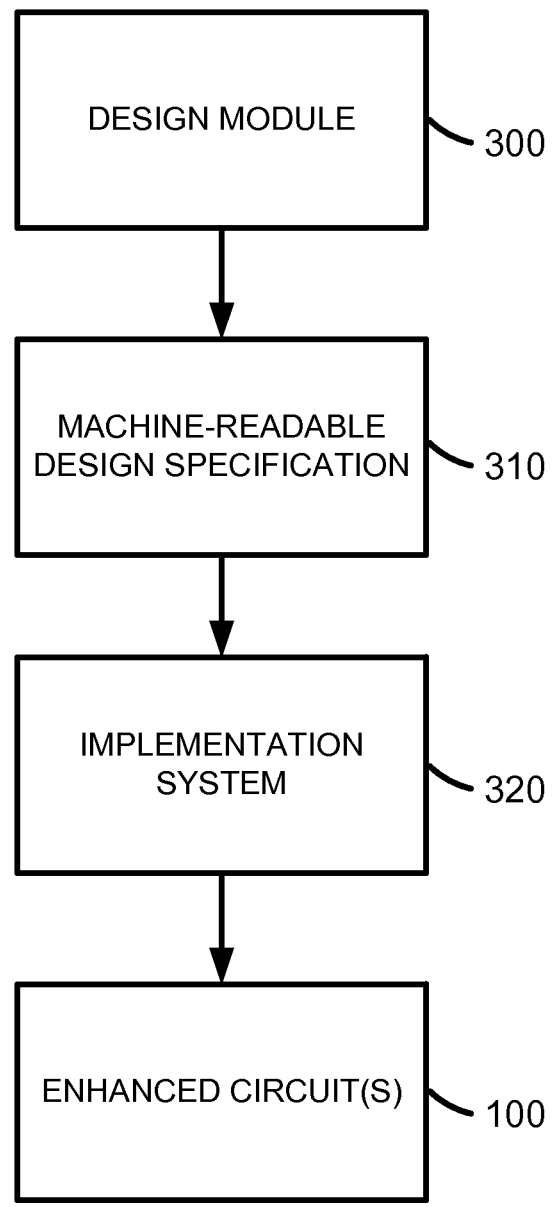
FIG. 3 depicts a system for developing an enhanced circuit such as the one shown in FIG. 1.

Referring to FIG. 3, Enhanced circuits 100 can be implemented in a variety of different ways. In one embodiment, a specialized design module 300 is used in connection with standard layout tools, such as Cadence SOC Encounter, Synopsys, IC Compiler, Xilinx ISE, or Altera Quartus, to produce a machine-readable design specification 310 for the circuit, such as a GDSII or bit file. The machine-readable design specification can then be read by implementation systems 320 to implement the circuit as an integrated circuit or a programmable logic device. The specialized design module and layout tools are presently contemplated as being implemented in connection with a special-purpose software program implemented using Python and C++ running on a general-purpose computer platform such as Linux® or Windows ®, but they could also be implemented using other development tools and/or platforms or in whole or in part using special-purpose hardware.

The present invention has now been described in connection with a number of specific embodiments thereof. However, numerous modifications which are contemplated as falling within the scope of the present invention should now be apparent to those skilled in the art. Therefore, it is intended that the scope of the present invention be limited only by the scope of the claims appended hereto. In addition, the order of presentation of the claims should not be construed to limit the scope of any particular term in the claims.

What is claimed is:

1. A data collection system for an electrical circuit, the data collection system comprising:
   a. a configurable selection network, comprising:
      i. configurable selection logic,
      ii. data input lines operatively connected to a first set of debug nodes of the electrical circuit and the configurable selection logic,
      iii. data output lines operatively connected to the configurable selection logic, and
      iv. a configuration control input operatively connected to the configurable selection logic to configure the configurable selection logic,
   wherein the configurable selection network is a configurable unordered selection network.

2. The data collection system of claim 1, wherein the configurable selection network is a non-blocking network.

3. The data collection system of claim 1, wherein the configurable selection network is configurable after implementation of the electrical circuit to obtain data from a second set of debug nodes of the electrical circuit, the second set of debug nodes being a subset of the first set of debug nodes.

4. The data collection system of claim 3, further comprising
   a. a configurable data packer; and
   b. a data storage element.

5. The data collection system of claim 4, comprising a controller arranged to configure the configurable data packer based on a configuration of the configurable selection network.

6. The data collection system of claim 4, comprising a controller arranged to associate data from the second set of debug nodes with individual debug nodes of the electrical circuit based on at least one of:
   a. a configuration of the configurable selection network; and
   b. a configuration of the configurable data packer.

7. A design tool for generating a data collection system for an electrical circuit, comprising:
   a design module operative to specify a configurable selection network that includes:
      i. configurable selection logic,
      ii. data input lines operatively connected to a first set of debug nodes of the electrical circuit and the configurable selection logic,
      iii. data output lines operatively connected to the configurable selection logic, and
      iv. a configuration control input operatively connected to the configurable selection logic to configure the configurable selection logic,
   wherein the configurable selection network is a configurable unordered selection network.

8. The design tool of claim 7, wherein the configurable selection network is a non-blocking network.

9. The design tool of claim 7, wherein the configurable selection network is configurable after implementation of the electrical circuit to obtain data from a second set of debug nodes of the electrical circuit, the second set of debug nodes being a subset of the first set of debug nodes.

10. The design tool of claim 7, wherein the design tool is further operative to specify
    a. a configurable data packer; and
    b. a data storage element.

11. A machine-readable design specification for a data collection system for an electrical circuit, stored in a non-transitory storage medium, comprising:
    a. a machine-readable design specification for a configurable selection network that includes:
       i. configurable selection logic,
       ii. data input lines operatively connected to a first set of debug nodes of the electrical circuit and the configurable selection logic,
       iii. data output lines operatively connected to the configurable selection logic, and
       iv. a configuration control input operatively connected to the configurable selection logic to configure the configurable selection logic,
    wherein the configurable selection network is a configurable unordered selection network.

12. The machine-readable design specification of claim 11, wherein the configurable selection network is a non-blocking network.

13. A method for collecting data from debug nodes of an electrical circuit, comprising:
    a. providing access to the debug nodes of the electrical circuit,
    b. selecting a first of a plurality of possible subsets of the debug nodes using a configurable unordered selection network, and
    c. routing data from the first subset of the nodes to outputs of the circuit.

14. The method of claim 13, further including the steps of:
    a. selecting a second of the plurality of possible subsets of the debug nodes, and
    b. routing data from the second subset of the nodes to outputs of the circuit.

15. A method for collecting data from debug nodes of an electrical circuit, the electrical circuit comprising a configurable selection network connected to a first set of debug nodes, the method comprising
    a. configuring the configurable selection network to route data from a second set of debug nodes to outputs of the configurable selection network, the second set of debug nodes being a subset of the first set of debug nodes;
    b. configuring the configurable selection network to route data from a third set of debug nodes to outputs of the configurable selection network, the third set of debug nodes being a subset of the first set of debug nodes and the third set of debug nodes being a different set from the second set of debug nodes,
    wherein the configurable selection network is a configurable unordered selection network.

16. A method for collecting data from debug nodes of an electrical circuit, the electrical circuit comprising a configurable data packer and a configurable selection network, the configurable selection network connected to a first set of debug nodes, the method comprising
    a. configuring the configurable selection network to route data from a second set of debug nodes to outputs of the configurable selection network, the second set of debug nodes being a subset of the first set of debug nodes;
    b. configuring the data packer based on a configuration of the configurable selection network, wherein the configurable selection network is a configurable unordered selection network.

17. The method of claim 16, further associating data from the second set of debug nodes with individual debug nodes of the electrical circuit based on at least one of:
  a. a configuration of the configurable selection network; and
  b. a configuration of the configurable data packer.

* * * * *